(12) United States Patent
Liu et al.

(10) Patent No.: US 6,203,863 B1
(45) Date of Patent: *Mar. 20, 2001

(54) METHOD OF GAP FILLING

(75) Inventors: Chih-Chien Liu, Taipei; Juan-Yuan Wu, Hsinchu; Water Lur; Shih-Wei Sun, both of Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/200,893

(22) Filed: Nov. 27, 1998

(51) Int. Cl.[7] ............... B05D 3/06; H01L 21/76

(52) U.S. Cl. ............ 427/579; 427/255.37; 438/788; 438/792; 438/435; 438/437; 438/695; 438/702

(58) Field of Search ............... 427/579, 255.37; 438/792, 788, 435, 437, 695, 702

(56) References Cited

U.S. PATENT DOCUMENTS

| 5,726,090 | * | 3/1998 | Jang et al. | 438/435 |
| 5,804,259 | * | 9/1998 | Robles | 427/577 |
| 5,814,564 | * | 9/1998 | Yao et al. | 438/723 |
| 5,817,567 | * | 10/1998 | Jang et al. | 438/427 |
| 5,968,610 | * | 10/1999 | Liu et al. | 427/579 |

* cited by examiner

Primary Examiner—Brian K. Talbot
(74) Attorney, Agent, or Firm—Oblon, Spivak, McClelland, Maier & Neustadt, P.C.

(57) ABSTRACT

A method of gap filling by using HDPCVD. On a substrate having a conductive structure, a first oxide layer is formed to protect the conductive structure. While forming the first oxide layer no bias is applied. An argon flow with a high speed of etching/deposition is provided to form a second oxide layer. While forming the second oxide layer a triangular or trapezium profile is formed due to an etching effect to the corner. An argon flow with a low speed of etching/deposition is provided to form a third oxide layer. The gap filling is completed.

20 Claims, 3 Drawing Sheets

METHOD OF GAP FILLING

BACKGROUND OF THE INVENTION

1. Field of the Invention

The invention relates to a method of a multi-step high density plasma (HDP) chemical vapour deposition (CVD), and more particularly to a method of filling a gap between conductive structures in a semiconductor device with dielectric material.

2. Description of the Related Art

In a semiconductor devices, multilevel conductive wiring and other conductors are normally isolated by inter-metal dielectric (IMD) layers. As the dimension of devices shrinks, the aspect ratio of the gap between conductive layers increases. The gap with a higher aspect ratio is more difficult to fill. On the other hand, as the distance between conductive layers and other conductors becomes shorter, the capacitance increases, so that the operating speed is limited. To achieve a higher efficiency with the shrinking dimension of devices, the dielectric layer between conductive layers are required to have characteristics such as being filled within the gap evenly and uniformly, preventing the water flow, and minimising the capacitance between conductive layers by using a low dielectric constant material.

Thus, it is important to deposit a high quality, interstice-free dielectric layer to fill a gap with a high aspect ratio. The dielectric layer is formed, for example, by CVD which is performed by introducing the precursor to the deposition surface, and after reaction, the material is deposited on the surface. Different kinds of CVD processes are in use, Such as atmospheric pressure CVD (APCVD), low pressure CVD (LPCVD), and plasma enhanced CVD (PECVD). To obtain high quality oxide by APCVD and LPCVD, a high deposition temperature such as about 650° C. to 850° C. is required. However, for some conductive material, for example, aluminium, such a high deposition temperature causes voids within oxide. Structures like voids absorb water, and thus, are not a proper IMD layer. By PECVD, plasma provides extra energy for reacting gases, and therefore, the deposition is performed in a lower temperature, for example, a temperature at about 400° C. or lower.

In a conventional method of forming a dielectric layer between conductive wiring, an interlayer is formed by PECVD using silane or tetra-ethyl-ortho-silicate (TEOS) as precursor. An accompanying spin-on-glass (SOG) layer is formed on the conductive wiring and to fill the gap therebetween. However, due to the characteristics of absorbing water and the formation of interstices, SOG layer cannot fill the gap completely. This phenomenon is even more obvious as the devices become smaller. Thus, a method to fill the gap with a high quality dielectric material is urgently in need to develop.

In addition, in a device with a smaller dimension, the conventional CVD cannot fill a gap with a higher aspect ratio completely. For example, using PECVD, interstices between conductive wiring are sealed by the deposited material. In the subsequent process, the interstices are open and contaminated. Therefore, the conductive wiring or the contact are damaged, and the device is degraded.

FIG. 1 and FIG. 2 show a method of filling a gap by a conventional PECVD process. Referring to FIG. 1, an oxide layer 10 is formed on a substrate 12 by PECVD with TEOS as a precursor. On a upper part of the side wall of the conductive wiring 14, an overhang 15 is formed. As the deposition continues, an interstice 16 is sealed as shown in FIG. 2. The interstice 16 is formed as a seam along the conductive wiring lengthwisely. The seam is near the end of the conductive wiring, or is restricted in the bending part of the conductive wiring. In the subsequent process, the interstice 16 is very likely to be uncovered, so that chemical for polishing or the by-product for etching is trapped by the interstice. The trapped material within the interstice is very difficult to remove, and thus, the yield of the subsequent process is degraded.

The HDPCVD is intensively developed due to the characteristics as follows. The HDPCVD is performed in a lower deposition temperature compared to other CVD processes. In the commercial application, for example, by Novellus System, Inc, HDPCVD has been applied to form a high density, water proof, and planarized dielectric layer. In a HDPCVD system, a high density plasma is supplied from different sources, for example, electron cyclotron resonance, inductively coupled plasma, or transformer coupled plasma. During the deposition, the plasma produced by any mechanism is controlled by the bias sputtered portion. By controlling the bias relative to the substrate, the condition of deposition, the energy of the precursor gases, and the range to etch and sputter can be altered. By precisely controlling the steps of depositing IMD layers, it is possible to fill the gap more smoothly without forming interstice. Moreover, in other deposition process such as PECVD, overhang is formed on the upper side wall of the gap. The formation of overhang cause the formation of interstice or void within the dielectric layer. By HDPCVD, an etching process is provided during deposition to remove the overhang. Thus, the possibility of forming interstice or void is reduced.

Using HDPCVD in the invention for gap filling, an additional process of sputtering occurs simultaneously. The effect of gap filling of HDPCVD is better than the conventional CVD. During HDPCVD, ions are accelerated by biased portion to etch the material deposited on the surface of the substrate and sputter the etched material. Furthermore, a recess is formed in the substrate, for example, a recess formed by ion flux. When an oxide is deposited on the substrate by HDPCVD including bias sputtering the surface of the substrate is etched by the oxide. Normally, during bias sputtering most of the ions are inert argon ions. The chemical mechanism is hardly performed. On the contrary, the physical mechanism is in use. In the function of the etching speed of oxide during HDPCVD and the incident angle of etching ions, a higher etching speed is obtained with a larger incident angle. The incident angle dependence of bias sputtering in HDPCVD causes etching in the corner faster than etching the other part. Thus, the portion to seal interstices or voids are etching and sputtered into the gap, and a flat surface is obtain. This is a characteristic of HDPCVD. It is to be noted that for any process regarding plasma technique, a mechanism of etch sputtering and deposition is included. The sputtering speed of the HDPCVD discussed in the invention is a comparison with the sputtering characteristic of PECVD as a standard.

Another advantage of HDPCVD is that during the deposition of oxide layer, the deposition is not necessary to be performed in a high temperature. The process of fabricating devices are simplified, so that the time to expose the device under a high temperature environment is reduced. In the invention, three steps are performed under different deposition condition for gap filling without degrading the quality of the conductive wiring.

Deposition and etching are performed simultaneously during HDPCVD. By bias deposition, the material on the side wall of the conductive wiring is removed and recombined to fill the gap. As mentioned above, the deposition portion prevents the formation of overhang on top corner of the conductive wiring, and thus, a better gap filling effect is obtained. It is to be noted that during HDPCVD, the conductive wiring or the passivation layer is damaged for over etching. Therefore, some deposition or other process is adjusted to protect the conductive wiring or the IMD layer. The above three steps of HDPCVD are used to fill the gap within the conductive wiring. The etching and deposition rate for each step are different.

SUMMARY OF THE INVENTION

It is therefore an object of the invention to provide a method of gap filling by using HDPCVD. The process includes different steps to control the speed of gap filling and protect structures of devices during deposition or etching.

To achieve these objects and advantages, and in accordance with the purpose of the invention, as embodied and broadly described herein, the invention is directed towards a method of gap filling by using HDPCVD. On a substrate having a conductive structure, a first oxide layer is formed to protect the conductive structure. While forming the first oxide layer, no bias is applied. An Jargon flow with a high speed of etching/deposition is provided to form a second oxide layer. While forming the second oxide layer, a triangular or trapezium profile is formed due to an etching effect to the corner. An argon flow with a low speed of etching/deposition is provided to form a third oxide layer. The gap filling is completed.

It is to be understood that both the foregoing general description and the s following detailed description are exemplary and explanatory only and are not restrictive of the invention as claimed.

DESCRIPTION OF THE PREFERRED EMBODIMENTS

Figure 1:
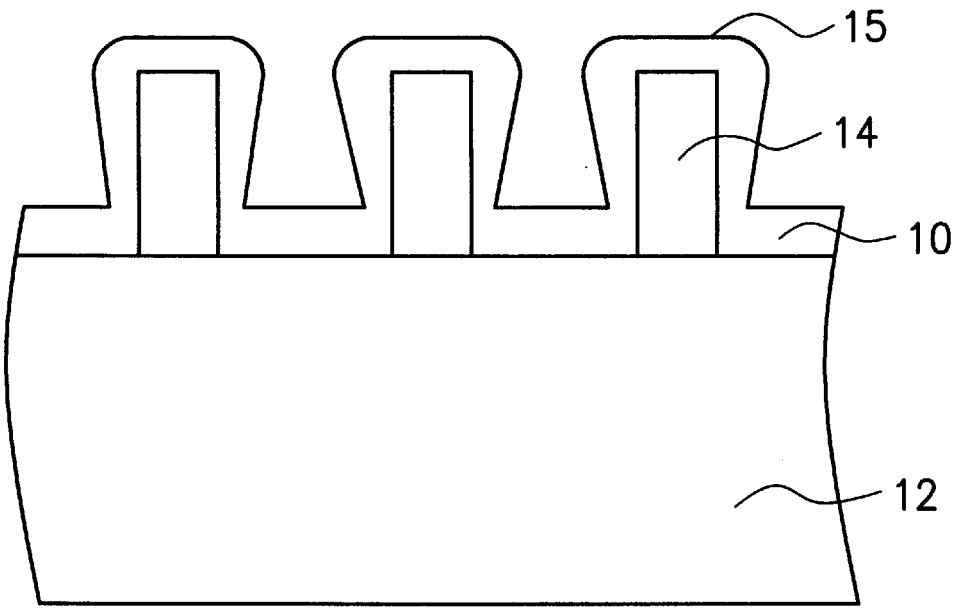
FIG. 1 and FIG. 2 are cross sectional views of gap filling by a conventional PECVD.
Figure 2:
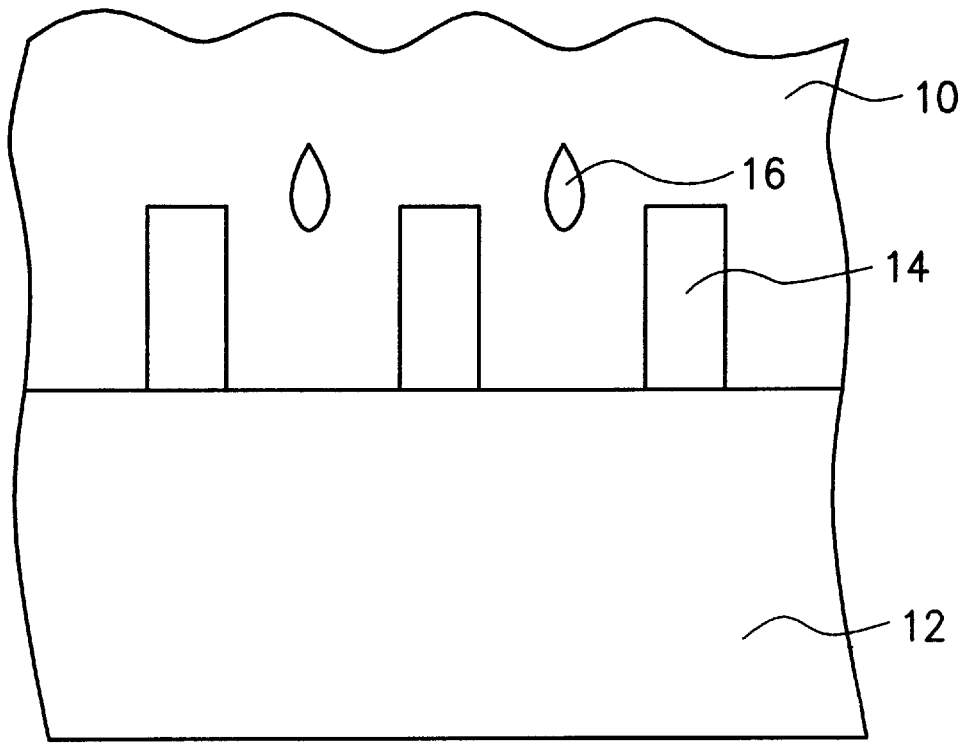
Figure 3A:
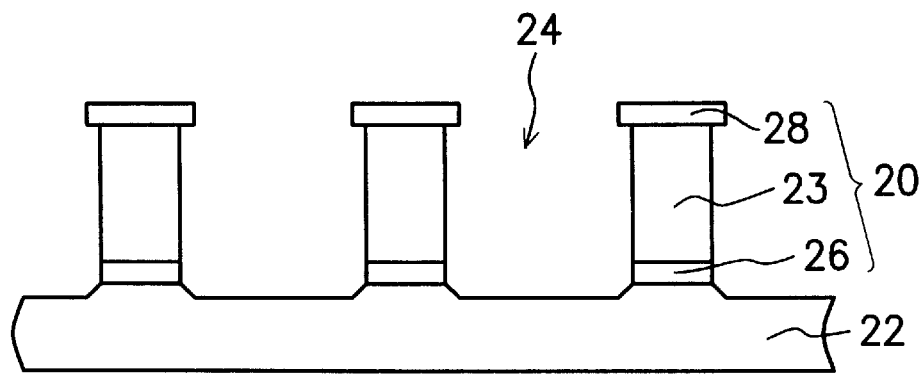
FIG. 3A to FIG. 3E are cross sectional views of gap filling by HDPCVD in a preferred embodiment according to the invention.

Referring FIG. 3A, on a semiconductor 22, a conductive wiring 20 is formed. The conductive wiring 20 comprises a conductive wiring layer 23, a barrier layer 26, and a passivation layer 28. The conductive wiring layer 23 can be formed by different kind of material, including aluminium, alloy of aluminium and silicon, alloy of aluminium and copper, copper alloy comprising copper and other multi-layer structure, and other multi-layer structure comprising cheaper metal such as metal with high melting point. A tap 24 is formed between the conductive wiring 20. The substrate 22 comprises different kinds of structures, such as a transistor, a diode, conventional semiconductor devices, or other metal layer. The barrier layer 26 is formed between the substrate 22 and the conductive wiring layer 23. In case that the substrate 22 connects with the conductive wiring layer 23 by silicon, and the conductive wiring layer 23 includes aluminium, the material of the barrier layer includes titanium nitride, titanium silicide, or titanium tungsten alloy. The formation of the barrier layer 26 is to prevent a mutual reaction between aluminium and silicon, for example, internal diffusion which causes aluminium spikes in the junction.

The formation of barrier layer 26 also has the function as a glue layer for forming the conductive wiring layer 23 on the substrate 22. In addition, the electron migration of aluminium wiring is minimised too. The passivation layer 28 is formed by the same material as the barrier layer 26. The functions of the passivation layer 28 are to protect the conductive wiring layer 23, limit the electron migration, provides more reusable contact during the subsequent process, and to be an anti-reflecting coating layer under photo-resist.

Figure 3B:
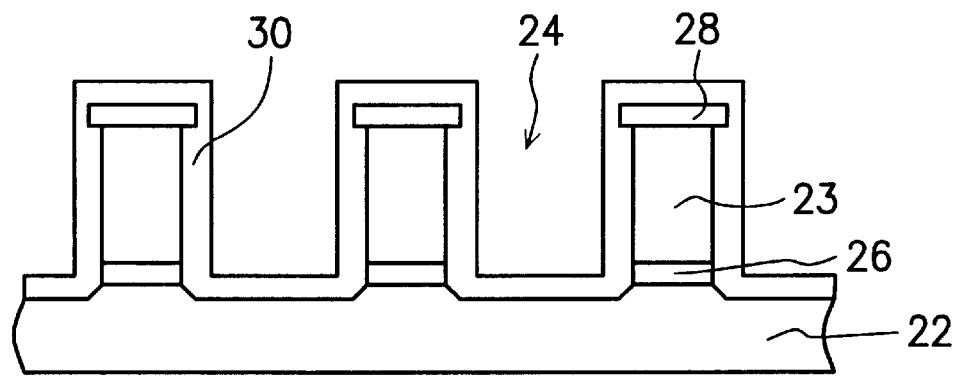

Referring to FIG. 3B, a first step of HDPCVD is performed to form a thin first oxide layer 30 over the substrate 22. The first step of HDPCVD is performed without applying pressure and voltage on the substrate 22. Therefore, no etching is performed during deposition. The effect of gap filling is poor. The purpose for not applying bias is to form a protective liner layer on the conductive wiring 20, so that in the subsequent etching/deposition process, the top corner of the conductive wiring is not cut away. The deposition material in the first step of HDPCVD includes oxide containing a large proportion of silicon, for example, SRO, $SiO_{2-x}$, to sustain polishing and to protect the conductive wiring 20.

Figure 3C:
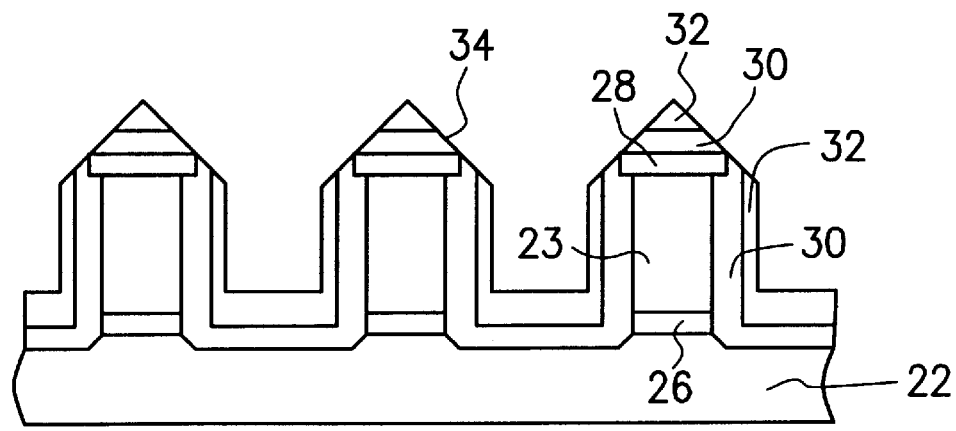

Referring to FIG. 3C, a second step of HDPCVD is performed to form a second oxide layer 32 on the first oxide layer 30. During deposition, an etching is performed simultaneously. Therefore, a top corner region 34 of the first oxide layer is etched back, and the resultant profiled is shown as the figure. Applying different bias to the substrate 22, different speed of etching/deposition is obtained. By controlling the flowing speed of the introduced inert gas such as argon, the quantity of argon relative to reacting gas such as silane ($SiH_4$) is controlled. Thus, the speed of gap filling and the profile of deposition is under control. The flowing speed is represented by the ratio of argon/silane. In the second step of HDPCVD, a high speed of argon flow is adapted. The ratio of argon/silane is larger than 1, and the speed of etching/deposition is larger than 0.25. During deposition, etching is performed simultaneously. The top corner region 34 of the first oxide layer 30, and the second oxide layer 32 on top are etched to form a triangular or trapezium profile.

Figure 3D:
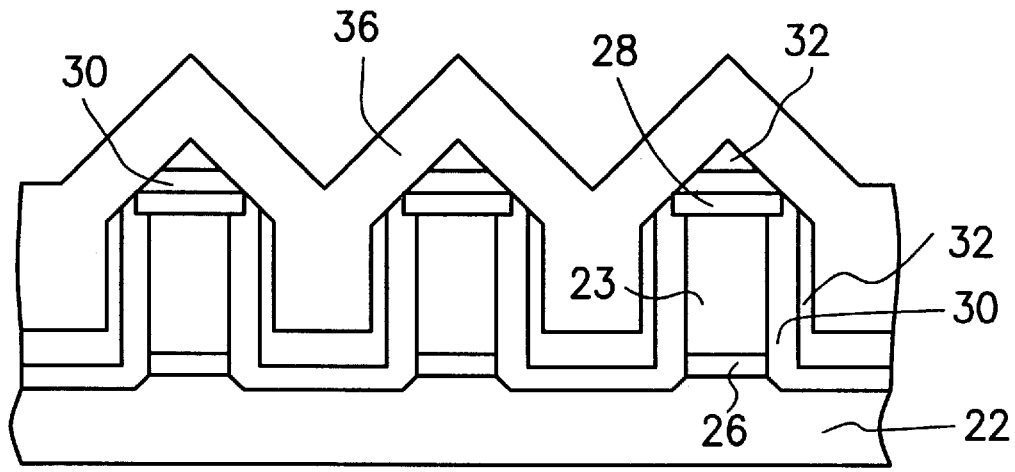

Referring to FIG. 3D, a low speed of argon flow is adapted in a third step. The ratio of argon/silane is less than 1, and the speed of etching/deposition is less than 0.2. The less etching and sputtering speed cause the gap 24 to be filled with a third oxide layer 36. The third oxide layer 36 is formed with a high density without interstice or void.

Figure 3E:
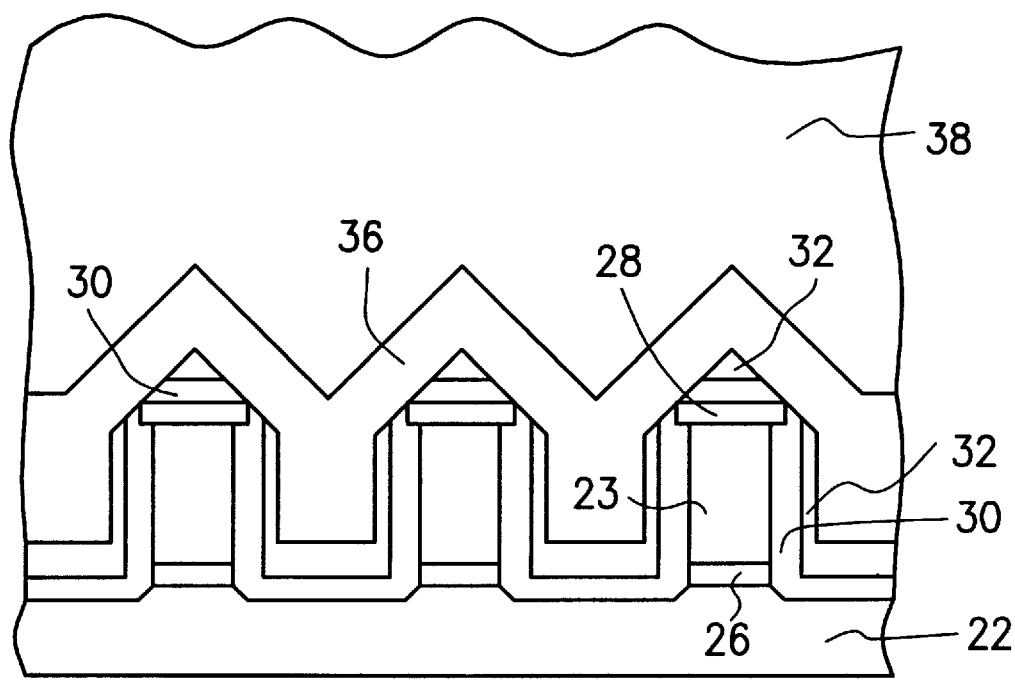

Referring to FIG. 3E, a dielectric layer 38 is formed on the third oxide layer. The material of the dielectric depends on the technique used. By HDPCVD or PECVD, oxide is selected due to a higher deposition rate without the formation of interstice or void.

In the invention, a higher speed argon flow and a higher speed etching/deposition are used for HDPCVD to form a triangular or trapezium profile. The subsequently formed oxide layer can then be filled within the gap without forming interstice or void. If an argon flow with a low speed is used to form an oxide layer, the effect of physical bombardment is poor, and therefore, a thicker oxide layer is deposited on the conductive wiring in the vertical direction. Thus, while filling the gap between the conductive wiring is filled, a seam is formed on the conductive wiring. The formation of seam causes the difficulty for the subsequent gap filling. Furthermore, interstices or voids are formed during the formation of oxide, or by the sputtering effect of etching causes a re-deposition effect.

Therefore, the invention provides a method of gap filling by using HDPCVD. On a conductive wiring layer, a first oxide layer is formed without applying bias. Using the first oxide layer as a liner layer, a top corner of the conductive wiring layer is protected from being cut by etching.

In the invention, a method of gap filling by using HDPCVD is provided. An argon flow with a high speed and a high etching/deposition rate is supplied to form a triangular or trapezium profile on top of the conductive wiring layer. To deposit a thick oxide on the conductive wiring layer along the vertical direction is avoided, and thus, the formation of a seam is prevented.

After the formation of a triangular or trapezium profile, with an argon flow with a low speed and a low etching/deposition rate, the gap is filled.

Other embodiment of the invention will appear to those skilled in the art from consideration of the specification and practice of the invention disclosed herein. It is intended that the specification and examples considered as exemplary only, with the true scope and spirit of the invention being indicated by the following claims.

What is claimed is:

1. A method for gap filling on a substrate having a plurality of conductive wirings and a gap between the conductive wirings, comprising:

performing a first high density plasma chemical vapor deposition to form a first liner layer on the substrate, wherein a first etching/deposition ratio is substantially zero;

performing a second high density plasma chemical vapor deposition to form a second liner layer on the first liner layer, wherein a second etching/deposition ratio with an etching effect is configured whereby portions of the first liner layer and the second liner layer on top corners of the conductive wirings are simultaneously etched; and performing a third high density plasma chemical vapor deposition to form an insulating layer on the second liner layer so as to fill the gap, wherein a third etching/deposition ratio suppresses etching.

2. The method according to claim 1, wherein the step of performing the first high density plasma chemical vapor deposition comprises the step of:

applying a zero bias to the substrate.

3. The method according to claim 1, wherein the step of performing the second high density plasma chemical vapor deposition comprises the step of:

applying a first bias to the substrate to obtain the second etching/deposition ratio.

4. The method according to claim 1, wherein the step of performing the second high density plasma chemical vapor deposition comprises the step of:

depositing with the second etching/deposition ratio greater than 0.25.

5. The method according to claim 1, wherein the step of performing the second high density plasma chemical vapor deposition comprises the step of:

depositing with a flowing rate ratio of an inert gas to a reaction gas greater than one.

6. The method according to claim 5, wherein the step of depositing comprises the step of:

utilizing argon as the inert gas.

7. The method according to claim 5, wherein the step of depositing comprises the step of:

utilizing argon as the inert gas and silane as the reaction gas.

8. The method according to claim 5, wherein the step of performing the third high density plasma chemical vapor deposition comprises the step of:

applying a second bias to the substrate to obtain the third etching/deposition ratio.

9. The method according to claim 5, wherein the step of performing the third high density plasma chemical vapor deposition comprises the step of:

depositing with the third etching/depositing ratio less than 0.2.

10. The method according to claim 5, wherein the step of performing the third high density plasma chemical vapor deposition comprises the step of:

depositing with the flowing rate ratio less than one.

11. The method according to claim 10, wherein the step of depositing with said flowing rate ratio greater than one comprises the step of:

utilizing argon as the inert gas.

12. The method according to claim 10, wherein the step of depositing with said flowing rate ratio less than one comprises the step of:

utilizing argon as the inert gas and silane as the reaction gas.

13. A method of gap filling on a substrate having a plurality of conductive wirings and a gap between the conductive wirings, comprising:

performing a first high density plasma chemical vapor deposition to form a first liner layer on the substrate, wherein a first etching/deposition ratio for the first high density plasma chemical vapor deposition is substantially zero;

performing a second high density plasma chemical vapor deposition to form a second liner layer on the first liner layer, wherein a first flowing rate ratio of an inert gas to a reaction gas is configured whereby portions of the first liner layer and the second liner layer on top corners of the conductive wirings are simultaneously etched; and performing a third high density plasma chemical vapor deposition to form an insulating layer on the second liner layer so as to fill the gap, wherein a second flowing rate ratio of the inert gas to the reaction gas suppresses etching.

14. The method according to claim 13, wherein the step of performing the first high density plasma chemical vapor deposition comprises the step of:

applying a zero bias to the substrate.

15. The method according to claim 13, wherein the step of performing the second high density plasma chemical vapor deposition comprises the step of:

depositing with the first flowing rate ratio greater than one.

16. The method according to claim 13, wherein the step of performing the third high density plasma chemical vapor deposition comprises the step of:

depositing with the second flowing rate ratio less than one.

17. The method according to claim 13, wherein the step of performing the second high density plasma chemical vapor deposition comprises the step of:

applying a bias to the substrate to control an etching rate on the second liner.

18. The method according to claim 17, wherein the step of performing the second high density plasma chemical vapor deposition comprises the step of:

depositing with a second etching/deposition ratio greater than 0.25.

19. The method according to claim 15, wherein the step of performing the third high density plasma chemical vapor deposition comprises the step of:

applying a bias to the substrate to suppress an etching rate.

20. The method according to claim 19, wherein the step of performing the third high density plasma chemical vapor deposition comprises the step of:

depositing with a third etching/deposition ratio less than 0.2.

* * * * *